(12) United States Patent
Jung

(10) Patent No.: US 8,125,026 B2
(45) Date of Patent: Feb. 28, 2012

(54) GATE OF TRENCH TYPE MOSFET DEVICE AND METHOD FOR FORMING THE GATE

(75) Inventor: Ji-Houn Jung, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 85 days.

(21) Appl. No.: 12/617,810

(22) Filed: Nov. 13, 2009

(65) Prior Publication Data

US 2010/0140690 A1   Jun. 10, 2010

(30) Foreign Application Priority Data

Dec. 9, 2008   (KR) .................. 10-2008-0124477

(51) Int. Cl.
*H01L 29/78* (2006.01)
*H01L 21/336* (2006.01)

(52) U.S. Cl. ........ 257/330; 257/329; 257/331; 257/332; 257/E29.257; 257/E29.26; 257/E29.262; 257/E21.41; 438/270

(58) Field of Classification Search .................. 257/329, 257/330, 331, 332, E29.257, E29.26, E29.262, 257/E21.41; 438/270
See application file for complete search history.

(56) References Cited

U.S. PATENT DOCUMENTS

| | | | | |
|---|---|---|---|---|
| 4,145,703 A * | 3/1979 | Blanchard et al. | ............ | 257/331 |
| 5,895,951 A * | 4/1999 | So et al. | .......... | 257/330 |
| 6,436,765 B1 * | 8/2002 | Liou et al. | ...................... | 438/259 |
| 6,916,693 B2 * | 7/2005 | Ohnuma et al. | .............. | 438/162 |
| 7,855,415 B2 * | 12/2010 | Challa et al. | ................... | 257/341 |
| 7,947,556 B2 * | 5/2011 | Kobayashi et al. | ........... | 438/270 |
| 2004/0166636 A1 * | 8/2004 | Darwish | ...................... | 438/270 |
| 2005/0272233 A1 * | 12/2005 | Lee et al. | ...................... | 438/585 |
| 2005/0275016 A1 * | 12/2005 | Qu | ................. | 257/342 |
| 2007/0145416 A1 * | 6/2007 | Ohta et al. | .................... | 257/213 |
| 2009/0140329 A1 * | 6/2009 | Yoshimochi | ................... | 257/330 |
| 2009/0258466 A1 * | 10/2009 | Kim | ............................. | 438/259 |
| 2010/0059797 A1 * | 3/2010 | Ngai et al. | .................... | 257/255 |
| 2010/0065905 A1 * | 3/2010 | Pan | ................. | 257/330 |
| 2010/0171172 A1 * | 7/2010 | Murase et al. | ................ | 257/330 |
| 2010/0258862 A1 * | 10/2010 | Yilmaz et al. | ................. | 257/330 |
| 2010/0320532 A1 * | 12/2010 | Peake et al. | .................... | 257/330 |
| 2011/0031551 A1 * | 2/2011 | Andrews | ....................... | 257/330 |

* cited by examiner

*Primary Examiner* — Victor A Mandala
(74) *Attorney, Agent, or Firm* — Sherr & Vaughn, PLLC

(57) ABSTRACT

A gate of a trench type MOSFET device and a method of forming a gate. A gate of a trench type MOSFET device may include a gate oxide film formed on and/or over a trench type gate poly such that parasitic capacitance may be produced in a gate poly. An electric field may be substantially uniformly formed in a MESA region surrounding a gate poly. An overcurrent may be substantially prevented from flowing into a MOS channel around a gate. A gate oxide film may be substantially prevented from being destroyed and/or leakage may be substantially prevented. Reliability of a device may be maximized.

18 Claims, 5 Drawing Sheets

GATE OF TRENCH TYPE MOSFET DEVICE AND METHOD FOR FORMING THE GATE

The present application claims priority under 35 U.S.C. 119 to Korean Patent Application No. 10-2008-0124477 (filed on Dec. 9, 2008) which is hereby incorporated by reference in its entirety.

BACKGROUND

Embodiments relate to a method of fabricating a metal oxide silicon field effect transistor (MOSFET) and a device thereof. Some embodiments relate to a gate of a trench type MOSFET device and a method of forming a gate.

Power MOSFET devices may be used in various electronic devices including a notebook PC, a battery pack, a digital camera, a desk top PC, an LCD monitor, a B/L inverter, a graphic card, and the like. Power MOSFET devices may include, for example, relatively high switching speed, high thermal stability, high power gain in high input impedance, and/or convenience of use. Power MOSFET devices may employ a trench type MOSFET structure in which a buried gate may be formed by forming a trench substantially perpendicular to a substrate instead of an existing horizontal gate, growing an oxide film on and/or over a sidewall of a trench, and/or filling a trench with polysilicon to hold a high voltage and/or regulate a relatively large current.

Figure 1:
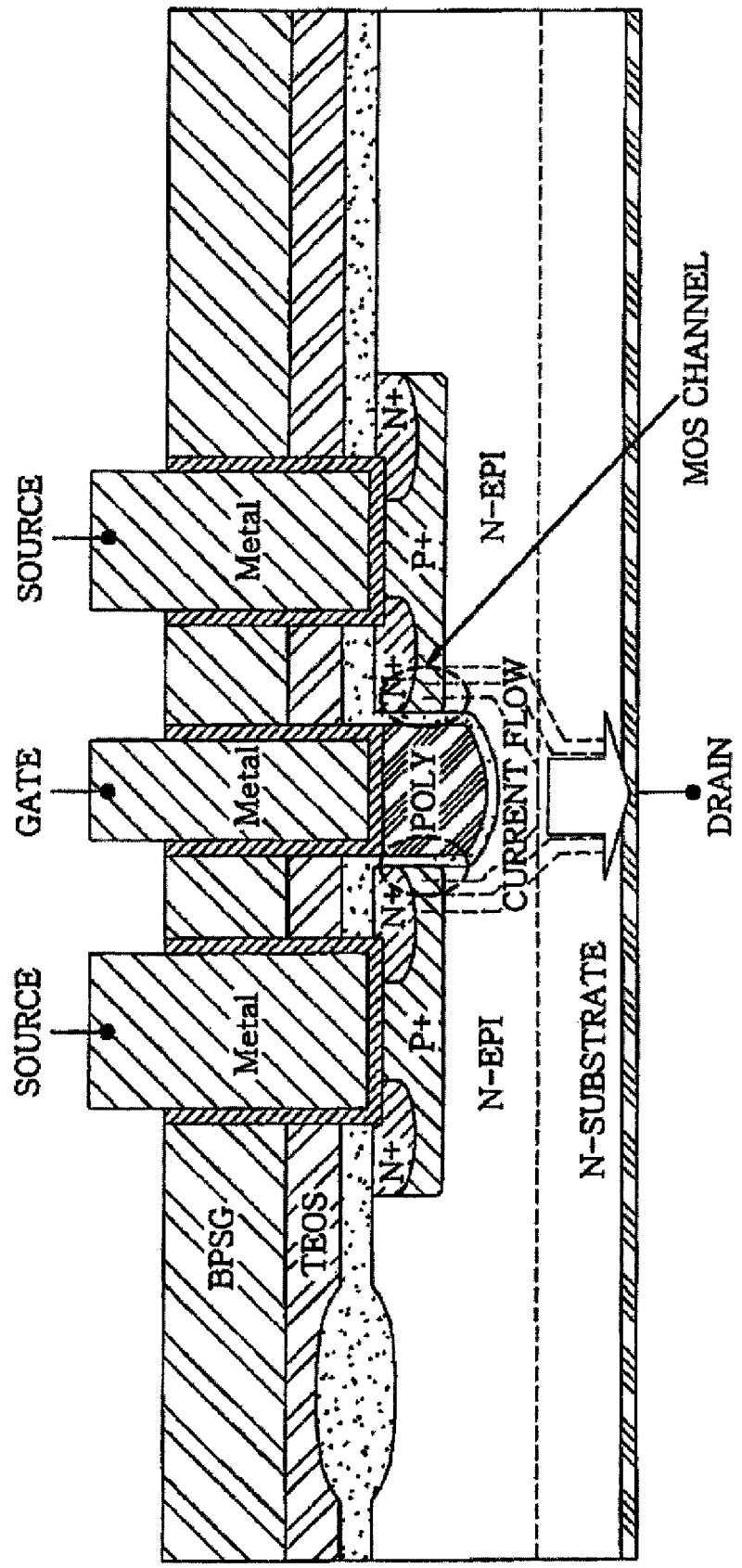

Referring to FIG. 1, a trench type MOSFET device may include a structure in which a gate poly may be buried in the form of a trench on and/or over a substrate. A trench type MOSFET may be advantageous for relatively high integration since a size of a MESA area connected to a source may be minimized. However, in a trench type MOSFET device, a relatively high electric field may be applied to a gate poly in a structure using a deep trench gate, which may cause an overcurrent to flow through a MOS channel around a gate. Therefore, substantial destruction of a gate oxide film and/or leakage due to an overcurrent flowing through a MOS channel may occur.

Accordingly, there is a need for a method of manufacturing a device and a device thereof that may maximize device reliability. There is a need for a method of manufacturing a device and a device thereof that may, for example, substantially uniformly form an electric field in a MESA area surrounding a gate in a trench type power MOSFET device and/or which may substantially prevent an overcurrent from flowing into a MOS channel around a gate.

SUMMARY

Embodiments relate to a method of fabricating a metal oxide silicon field effect transistor (MOSFET) and a device thereof. Some embodiments relate to a gate of a trench type MOSFET device and a method of forming a gate. According to embodiments, a gate of a trench type MOSFET device and a method of forming a gate may be capable of maximizing device reliability. In embodiments, a gate of a trench type MOSFET device and a method of forming a gate may substantially uniformly form an electric field in a MESA area surrounding a gate in a trench type power MOSFET device. In embodiments, an overcurrent flowing into a MOS channel around a gate may be minimized.

Embodiments relate to a metal oxide silicon field effect transistor (MOSFET). According to embodiments, a gate of a trench type MOSFET device may include a first gate oxide film formed on and/or over an inner wall of a trench region in which a gate may be formed. In embodiments, a gate of a trench type MOSFET device may include a first polysilicon film of a predetermined thickness, which may be deposited on and/or over a first gate oxide. In embodiments, a gate of a trench type MOSFET device may include a second gate oxide film deposited on and/or over a first polysilicon film. In embodiments, a gate of a trench type MOSFET device may include a second polysilicon film deposited on and/or over a second gate oxide film, with which a trench region may be gap-filled.

Embodiments relate to a method of manufacturing a metal oxide silicon field effect transistor (MOSFET). According to embodiments, a method of forming a gate of a trench type MOSFET device may include forming a first gate oxide film on and/or over an inner wall of a trench region, in which a gate may be formed. In embodiments, a method of forming a gate of a trench type MOSFET device may include forming a first polysilicon film on and/or over a surface, which may be an entire surface, of a semiconductor substrate which may include a trench region. In embodiments, a method of forming a gate of a trench type MOSFET device may include forming a photoresist mask on and/or over a first polysilicon film such that a trench region may be opened.

According to embodiments, a method of forming a gate of a trench type MOSFET device may include etching a first polysilicon film using a photoresist mask such that a first polysilicon film may be left having a predetermined thickness on and/or over a trench region. In embodiments, a method of forming a gate of a trench type MOSFET device may include forming a second gate oxide film on and/or over a first polysilicon film on and/or over a trench region. In embodiments, a method of forming a gate of a trench type MOSFET device may include forming and/or etching back a second polysilicon film on and/or over a surface, which may be an entire surface, of a semiconductor substrate.

According to embodiments, by forming a gate oxide film on and/or over a trench type gate poly such that parasitic capacitance may be produced in the gate poly, an electric field may be substantially uniformly formed in a MESA region surrounding a gate poly. In embodiments, an overcurrent may be substantially prevented from flowing into a MOS channel around a gate. In embodiments, it may be possible to substantially prevent an overcurrent from flowing into a MOS channel around a gate poly. In embodiments, a gate oxide film may be substantially prevented from being destroyed. In embodiments, a leakage may be substantially prevented from occurring. In embodiments, device reliability may be maximized.

DRAWINGS

Example FIG. 1 is a sectional view of a trench type MOSFET device.

Example FIG. 2A to FIG. 2F are sectional views of a method of manufacturing a MOSFET device having a buffer-structured gate in accordance with embodiments.

Figure 3:
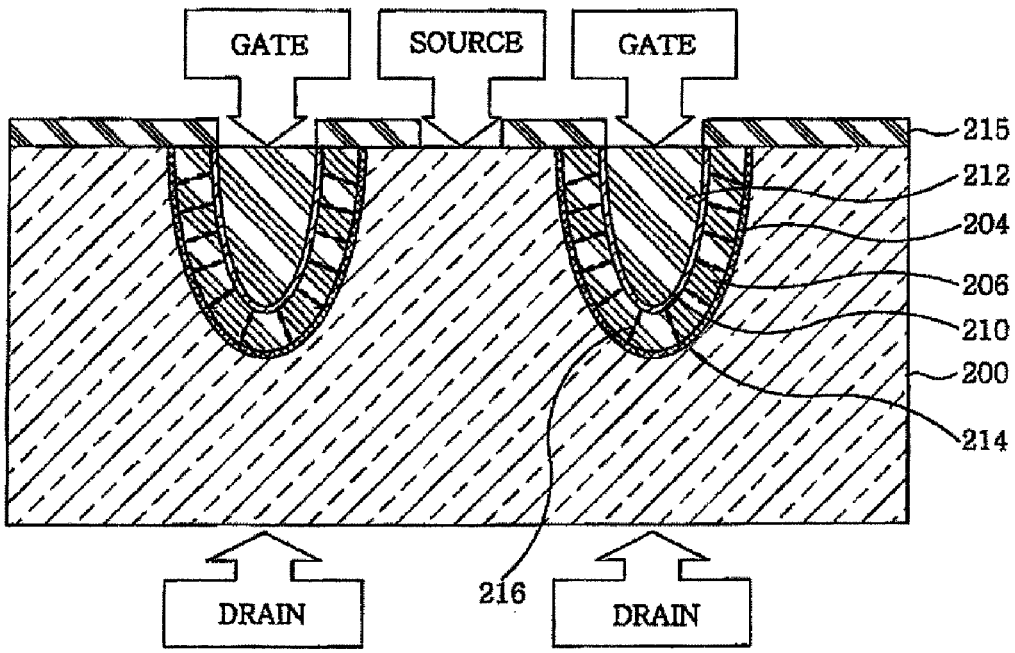

Example FIG. 3 illustrates parasitic capacitance produced in a buffer-structured gate in accordance with embodiments.

Figure 4:
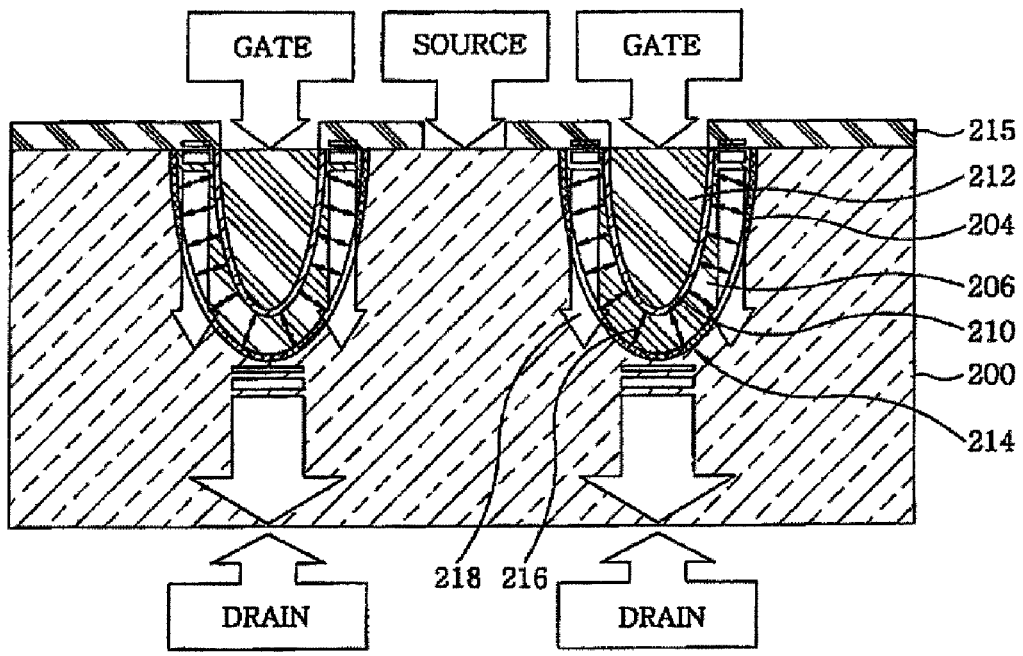

Example FIG. 4 illustrates generation of an electric field in a MOSFET having a buffer-structured gate in accordance with embodiments.

DESCRIPTION

Embodiments relate to producing parasitic capacitance in a gate poly. According to embodiments, a gate oxide film may be formed on and/or over a trench type gate poly. In embodiments, an electric field may be substantially uniformly formed on and/or over a MESA area surrounding a gate. In embodiments, an overcurrent may be substantially prevented from flowing into an MOS channel around a gate.

Figure 2A:
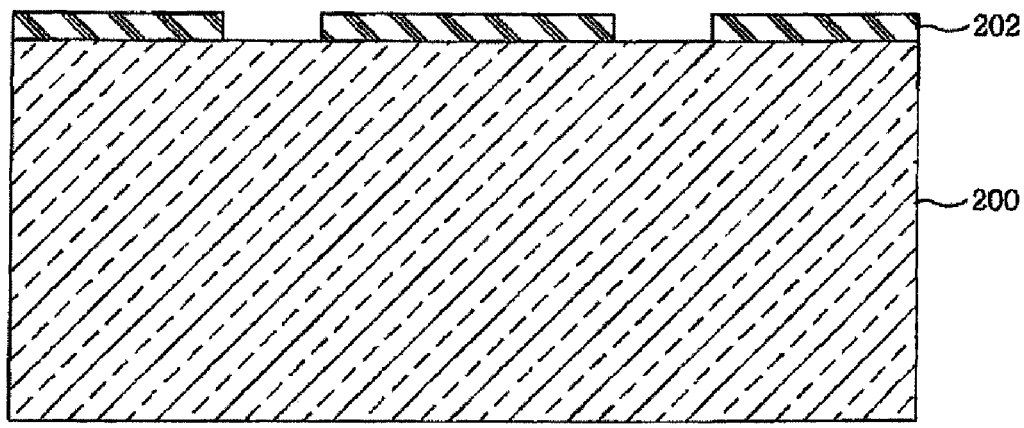

Embodiments relate to a method of manufacturing a metal oxide silicon field effect transistor (MOSFET). Referring to example FIG. 2A to FIG. 2F, sectional views illustrate a method of fabricating a trench type power MOSFET device having a buffer-structured gate in accordance with embodiments. Referring to FIG. 2A, a photoresist film may be applied and/or patterned on and/or over a semiconductor substrate, such as semiconductor substrate 200. In embodiments, photoresist mask 202 may be formed and may be used to etch a region in which a trench may be formed.

Figure 2B:
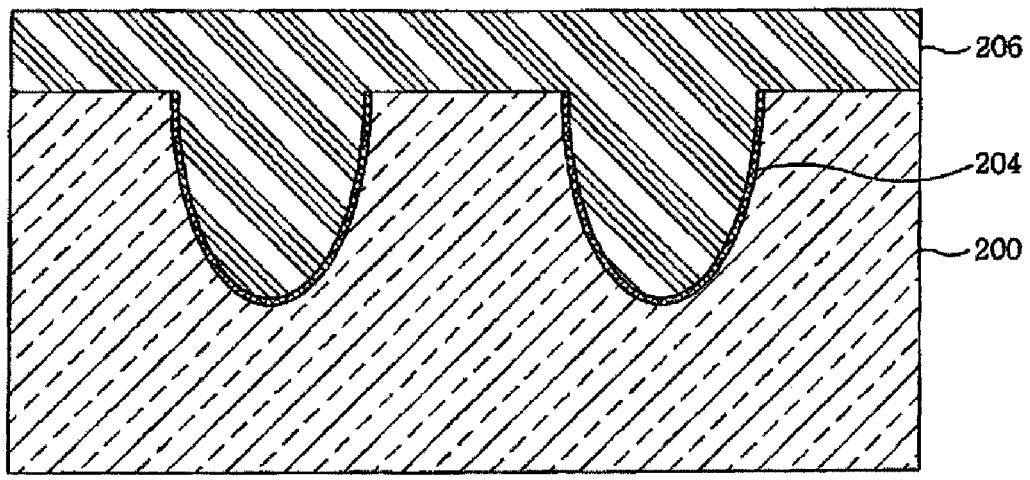

Referring to FIG. 2B, semiconductor substrate 200 may be etched using photoresist mask 202 to form a trench in which a gate poly may be formed. According to embodiments, first gate oxide film 204 may be formed. In embodiments, polysilicon film 206 may be deposited on and/or over first gate oxide film 204 to gap-fill a trench with a polysilicon film.

Figure 2C:
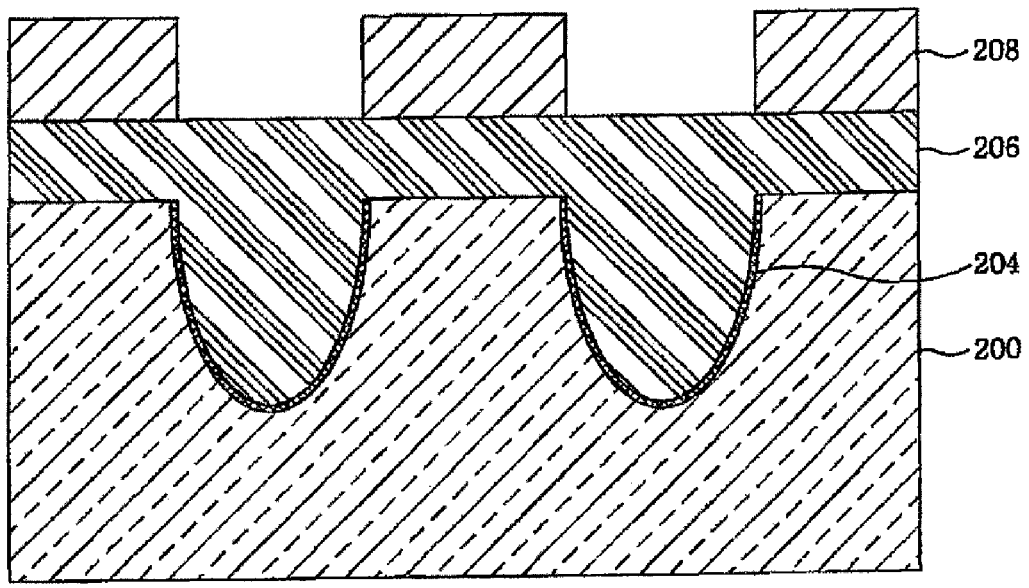

Referring to FIG. 2C, an additional photoresist film may be applied on and/or over a semiconductor substrate on and/or over which polysilicon film 206 may be deposited. According to embodiments, an additional photoresist film may be patterned such that a trench region may be opened to form photoresist mask 208. In embodiments, photoresist mask 208 may be used to etch polysilicon film 206 having a trench region gap-filled.

Figure 2D:
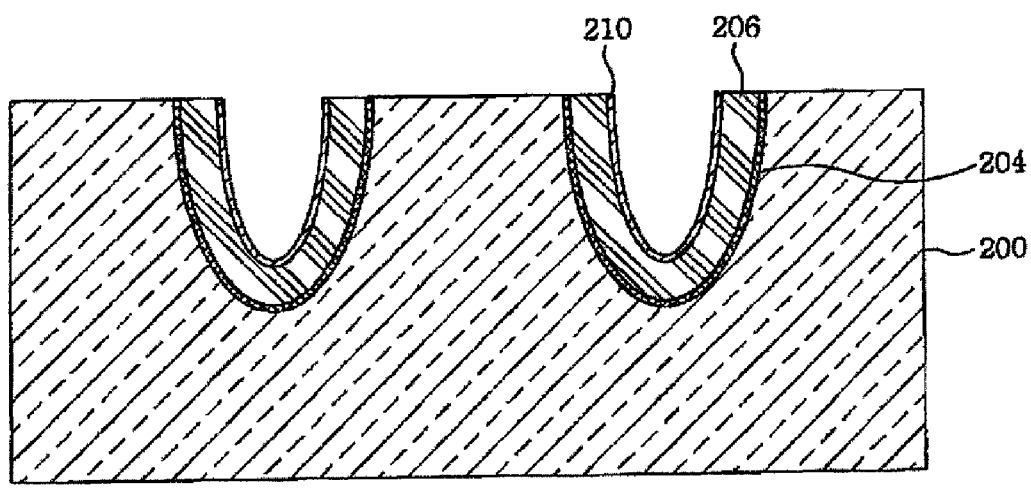

Referring to FIG. 2D, polysilicon film 206 which may have a trench region gap-filled may be etched using photoresist mask 208 such that polysilicon film 206 may be left having a predetermined thickness on and/or over a trench region. According to embodiments, second gate oxide film 210 may be formed on and/or over a surface of polysilicon film 206 left having a predetermined thickness on and/or over a trench region. In embodiments, polysilicon film 206 may be etched such that it may remain having a predetermined thickness between approximately 500 Å and 1000 Å on and/or over a trench region.

Figure 2E:
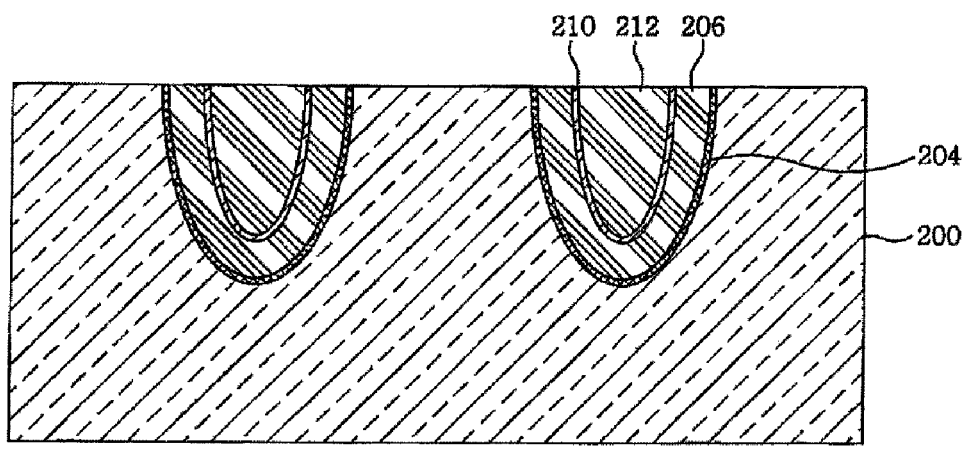
Figure 2F:
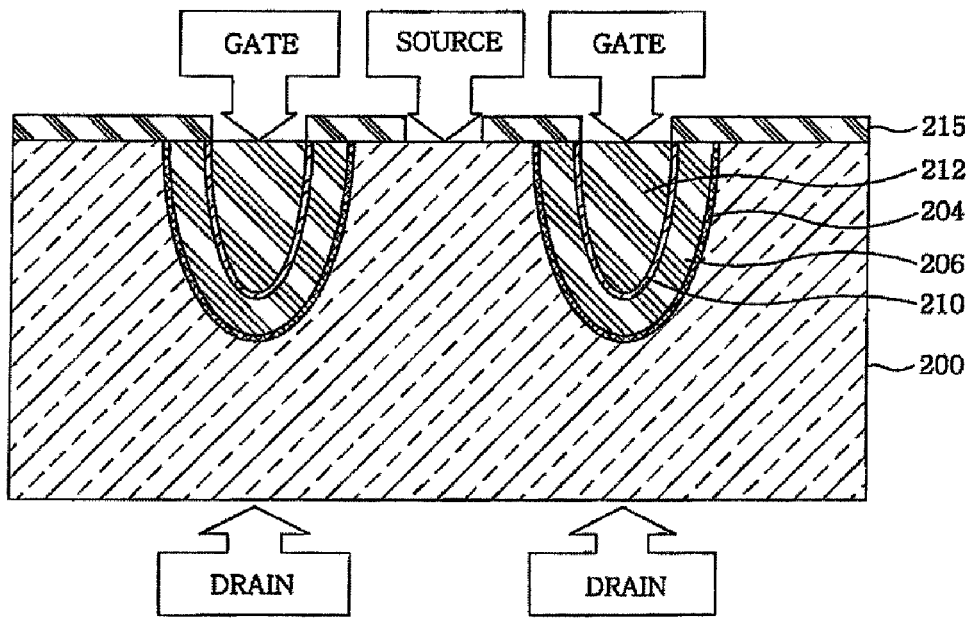

Referring to FIG. 2E, polysilicon film 212 may be deposited on and/or over a surface, which may be an entire surface, of a semiconductor substrate to gap-fill a trench region including polysilicon film 212. According to embodiments, deposited polysilicon film 212 may be etched back to form gate poly 214 having a buffer structure in which second gate oxide film 210 may be inserted. Referring to FIG. 2F, insulating film 215 may be formed on and/or over a semiconductor substrate. According to embodiments, gate, source and/or drain connecting lines may be formed to complete a trench type MOSFET structure having a buffer-structured gate.

Referring to example FIG. 3, an electric field generated in a trench type MOSFET device having a buffer-structure gate in accordance with embodiments is illustrated. According to embodiments, in a structure of a trench type MOSFET device having a buffer-structure gate, parasitic capacitance 216 may be produced between first gate oxide film 204 and second gate oxide film 210, for example due to second gate oxide film 210 inserted on and/or over a lower region of gate poly 214. In embodiments, parasitic capacitance 216 may cause an electric field of trench type gate poly 214 to be delivered to a MESA region, which may not be directly and/or may be after its noise may be buffered.

Referring to example FIG. 4, a flow of current in a trench type MOSFET device having a buffer-structured gate in accordance with embodiments is illustrated. According to embodiments, although a trench type MOSFET device may include a structure in which a gate may be buried in a trench region in such a manner that a surface area of a gate may be maximized, since an area of a gate exposed to a MESA structure may relatively increase by approximately three times, it may be important to properly control an electric field exposed to a source portion. In embodiments, forming second gate oxide film 210 having a buffer structure may perform a buffering operation in trench type gate poly 214 such that gate poly parasitic capacitance 216 may be produced between first gate oxide 204 and second gate oxide 210. In embodiments, an electric field may be substantially uniformly formed in a MESA region surrounding gate poly 214. In embodiments, a flow of current 218 may be substantially prevented, which may be formed from a source to a drain, from being biased to gate poly 214.

According to embodiments, it may be possible to substantially prevent an overcurrent from flowing into a MOS channel around gate poly 214. In embodiments, first gate oxide film 204 may be substantially prevented from being destroyed. In embodiments, a leakage may be substantially prevented from occurring. In embodiments, device reliability may be maximized.

According to embodiments, a gate of a trench type MOSFET device may be formed by forming a gate oxide film on and/or over a trench type gate poly such that parasitic capacitance may be produced in a gate poly. In embodiments, an electric field may be substantially uniformly formed on and/or over a MESA region surrounding a gate poly. In embodiments, an overcurrent may be substantially prevented from flowing into a MOS channel around a gate.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
    a first gate oxide film formed over a trench region;
    a first polysilicon film deposited over said first gate oxide film to have a predetermined thickness;
    a second gate oxide film deposited over said first polysilicon film; and
    a second polysilicon film over said second gate oxide film, wherein said predetermined thickness of said first polysilicon film is between approximately 500 Å and 1000 Å.

2. The apparatus of claim 1, wherein:
    said first oxide film is formed at least over a portion of an inner wall of said trench region; and
    said second polysilicon film gap-fills said trench region.

3. The apparatus claim 1, wherein parasitic capacitance is produced between said first gate oxide film and said second gate oxide film.

4. The apparatus of claim 1, wherein at least one of:
    an electric field is substantially uniformly formed in a MESA region surrounding a gate poly; and
    an overcurrent is substantially prevented from flowing into a MOS channel around a gate.

5. The apparatus of claim 1, comprising a trench type MOSFET device.

6. The apparatus of claim 5, wherein a gate is buried in said trench region.

7. The apparatus of claim 1, comprising an insulating film over a least a portion of a semiconductor substrate in which said trench region is formed.

8. A method comprising:
    forming a first gate oxide film over a trench region;
    forming a first polysilicon film over a surface of a semiconductor substrate in which the trench region is formed and the first gate oxide film;

forming a photoresist mask over said first polysilicon film exposing the first polysilicon film over said trench region;

etching said first polysilicon film using said photoresist mask such that said first polysilicon film remains having a predetermined thickness over said trench region;

forming a second gate oxide film over first polysilicon film-said over said trench region; and forming a second polysilicon film over the second gate oxide film, wherein said predetermined thickness of said first polysilicon film is between approximately 500 Å and 1000 Å.

9. The method of claim 8, wherein:

said first oxide film is formed at least over a portion of an inner wall of said trench region; and said second polysilicon film gap-fills said trench region.

10. The method of claim 8, wherein at least one of said first polysilicon film and said second polysilicon film is formed over substantially the entire surface of said semiconductor substrate.

11. The method of claim 8, wherein forming said second polysilicon film comprises an etch back process.

12. The method of claim 8, wherein forming said photoresist mask comprises:

applying a photoresist film over the surface of said semiconductor substrate over which said first polysilicon film is formed; and patterning said photoresist film such that said trench region is exposed.

13. The method of claim 12, wherein said photoresist film is applied to substantially the entire surface of said semiconductor substrate.

14. The method of claim 8, wherein parasitic capacitance is produced between said first gate oxide film and said second gate oxide film.

15. The method of claim 8, wherein at least one of:

an electric field is substantially uniformly formed in a MESA region surrounding a gate poly; and an overcurrent is substantially prevented from flowing into a MOS channel around a gate.

16. The method of claim 8, comprising forming a trench type MOSFET device.

17. The method of claim 16, comprising forming a gate buried in said trench region.

18. The method of claim 8, comprising forming an insulating film over a least a portion of said semiconductor substrate.

* * * * *